United States Patent
Hayashi et al.

(10) Patent No.: US 7,910,923 B2
(45) Date of Patent: Mar. 22, 2011

(54) SEMICONDUCTOR DEVICE

(75) Inventors: Tetsuya Hayashi, Yokosuka (JP);
Masakatsu Hoshi, Yokohama (JP);
Hideaki Tanaka, Yokohama (JP);
Shigeharu Yamagami, Yokohama (JP)

(73) Assignee: Nissan Motor Co., Ltd., Yokohama-shi, Kanagawa (JP)

(*) Notice: Subject to any disclaimer, the term of this patent is extended or adjusted under 35 U.S.C. 154(b) by 363 days.

(21) Appl. No.: 11/961,221

(22) Filed: Dec. 20, 2007

(65) Prior Publication Data
US 2008/0210938 A1 Sep. 4, 2008

(30) Foreign Application Priority Data
Dec. 22, 2006 (JP) ................................ 2006-346107

(51) Int. Cl.
*H01L 29/04* (2006.01)
(52) U.S. Cl. ...................... 257/51; 257/64; 257/E29.292
(58) Field of Classification Search .................. 257/472, 257/109, 121, 212, 51, 64, E29.292
See application file for complete search history.

(56) References Cited

U.S. PATENT DOCUMENTS
5,998,833 A 12/1999 Baliga
7,436,004 B2 * 10/2008 Shimoida et al. ............. 257/183

FOREIGN PATENT DOCUMENTS
EP 1 519 419 A2 3/2005
JP 2003-318398 A 11/2005

* cited by examiner

*Primary Examiner* — Jerome Jackson, Jr.
*Assistant Examiner* — Dale Page
(74) *Attorney, Agent, or Firm* — Young Basile

(57) ABSTRACT

A semiconductor device with superior long-term reliability is disclosed that alleviates current concentration into a switch structure arranged at an outermost portion. The semiconductor device comprises hetero semiconductor regions formed of polycrystalline silicon having a band gap width different from that of a drift region and hetero-adjoined with the drift region, a gate insulation film, a gate electrode adjoined to the gate insulation film, a source electrode connected to a source contact portion of the hetero semiconductor regions and an outermost switch structure and a repeating portion switch structure with a drain electrode connected to a substrate region. In a conduction state, the outermost switch structure comprises a mechanism in which the current flowing at the outermost switch structure becomes smaller than the current flowing at the repeating portion switch structure.

19 Claims, 10 Drawing Sheets

US 7,910,923 B2

SEMICONDUCTOR DEVICE

CROSS-REFERENCE TO RELATED APPLICATION

This application claims priority from Japanese Patent Application Serial No. 2006-346107, filed Dec. 22, 2006, which is incorporated herein in its entirety by reference.

TECHNICAL FIELD

The present invention relates to a semiconductor device comprising a switch structure having a hetero semiconductor region, which is hetero-adjoined to a semiconductor substrate.

BACKGROUND

Japanese Laid-Open Patent Publication No. 2003-318398 discloses a semiconductor device having a switch structure wherein an $N^-$-type polycrystalline silicon region is formed and adjoined to a main surface of a semiconductor substrate. The semiconductor substrate has an $N^+$-type silicon carbide substrate on which an $N^-$-type silicon carbide epitaxial region is formed. In this switch structure, the $N^-$-type silicon carbide epitaxial region and the $N^-$-type polycrystalline silicon region are hetero-adjoined to each other. Further, a gate electrode is formed adjacent to a heterojunction of the $N^-$-type silicon carbide epitaxial region and the $N^-$-type polycrystalline silicon region via a gate insulation film. The $N^-$-type polycrystalline silicon region is connected to a source electrode. Further, a drain electrode is formed on the other surface of the $N^+$-type silicon carbide substrate.

Such a semiconductor device, which has the switch structure as described above, functions as a switch by controlling an electric potential of the gate electrode when the source electrode is grounded and a predetermined positive electric potential is applied to the drain electrode. That is, when the gate electrode is grounded, a reverse bias is applied to the heterojunction of the $N^-$-type polycrystalline silicon region and the $N^-$-type silicon carbide epitaxial region such that no current flows between the drain electrode and the source electrode. However, when a predetermined positive voltage is applied to the gate electrode, a gate electric field is applied to the heterojunction interface of the $N^-$-type polycrystalline silicon region and the $N^-$-type silicon carbide epitaxial region. Because the thickness of an energy barrier defined by the heterojunction of a gate oxide film interface is reduced, the current can flow between the drain electrode and the source electrode. The semiconductor device with the above switch structure uses the heterojunction as a control channel for interrupting and conducting the current. Thus, the thickness of a hetero barrier functions as a length of the channel, and conductivity with a low resistance can be obtained.

BRIEF SUMMARY

Taught herein are embodiments of a semiconductor device. One such embodiment comprises a semiconductor substrate formed from a first semiconductor material, a hetero semiconductor region formed from a second semiconductor material having a band gap width different from that of the first semiconductor material wherein the hetero semiconductor region is hetero-adjoined with the semiconductor substrate. This embodiment of the semiconductor device can also include a gate insulation film adjoined to a heterojunction of the semiconductor substrate and the hetero semiconductor region, a gate electrode adjoined to the gate insulation film; a source electrode connected to a source contact portion of the hetero semiconductor region and a drain electrode connected to the semiconductor substrate. The plurality of switch elements comprise a first switch element arranged at an outermost portion of the semiconductor chip and a second switch element arranged at an inner portion of the semiconductor chip. The first switch element comprises a mechanism in which a current flowing at the first switch element becomes smaller than the current flowing at the second switch element when the switch elements are conducting the current.

BRIEF DESCRIPTION OF THE DRAWINGS

The description herein makes reference to the accompanying drawings wherein like reference numerals refer to like parts throughout the several views, and wherein.

DETAILED DESCRIPTION OF EMBODIMENTS OF THE INVENTION

Figure 1:
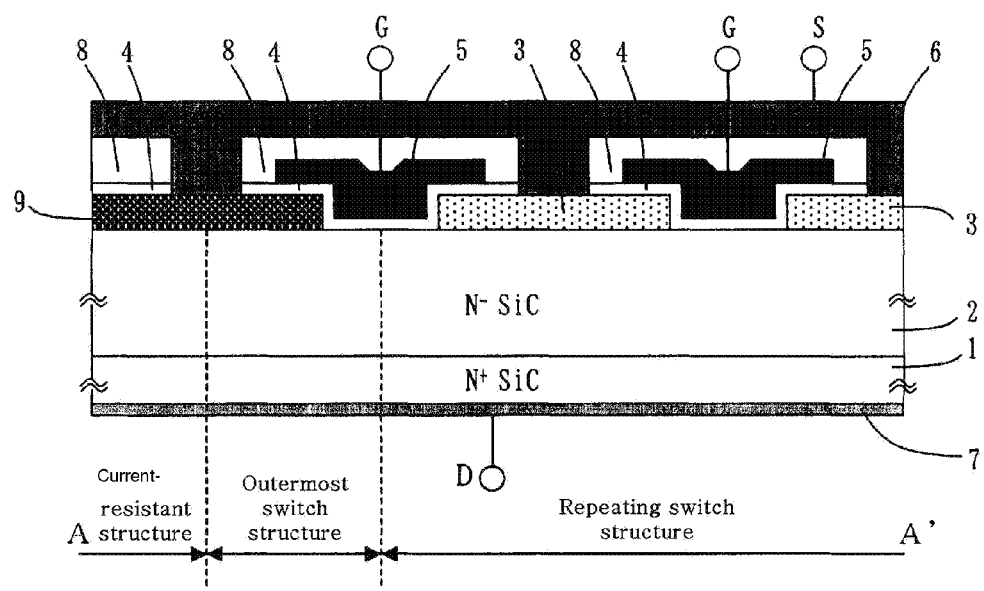
FIG. 1 is a cross-sectional view of a semiconductor device constructed in accordance with a first embodiment of the invention.

In order to obtain a semiconductor chip in a predetermined size wherein the above-mentioned conventional switch structures are arranged, a current-resistant structure portion for maintaining current resistance is formed at an outer side of an active region portion consisting of numerous switch structures, for example. The switch structure adjoined to the current-resistant structure portion exists at an outermost portion corresponding to the outermost side of the active region portion. Considering a current path of every switch structure at the time of conducting, when the current flows in the $N^-$-type silicon carbide epitaxial region or the $N^+$-type silicon carbide substrate, the current also flows at a portion located in the outer side of the active region portion where the switch structure is not formed. Accordingly, the current flows more easily in the switch structure formed at the outermost portion compared to the switch structure formed at other portions.

When conventional switch structures are simply arranged on the semiconductor chip, a current density of the switch structure formed at the outermost portion becomes higher than the current density of the switch structure formed at other portions. In other words, the current concentrates in the switch structure formed at the outermost portion, and, even when the semiconductor chip is used in a normal state, the outermost switch structure deteriorates more rapidly compared to the switch structure at other portions. Consequently, reliability is diminished.

When the semiconductor chip formed by the above-mentioned conventional switch structure is used, for example, an overcurrent or overvoltage may be generated in a conduction state in an L-load circuit at the time of a transient response when shifting from an interruption state to a conduction state. The overcurrent or overvoltage may also be generated at the time of a transient response when shifting from the conduction state to the interruption state. To this end, the semiconductor chip should have a short resistant load amount, an avalanche resistant amount and a destruction resistant amount for withstanding the overcurrent and overvoltage. However, as mentioned above, since the current density of the switch structure formed at the outermost portion becomes higher than the current density of the switch structure formed at other portions, the current concentrates into the switch structure formed at the outermost portion. Consequently, there is a limitation in improving the destruction resistant amount as well.

Accordingly, the inventors have identified a need for a semiconductor device having superior long-term reliability and destruction resistance through alleviating the concentration of the current into the switch structure formed at the outermost portion.

A semiconductor device constructed in accordance with embodiments taught herein are explained below with reference to FIGS. 1 to 14.

A first embodiment of the semiconductor device taught herein is explained with reference to FIGS. 1 to 6.

Figure 2:
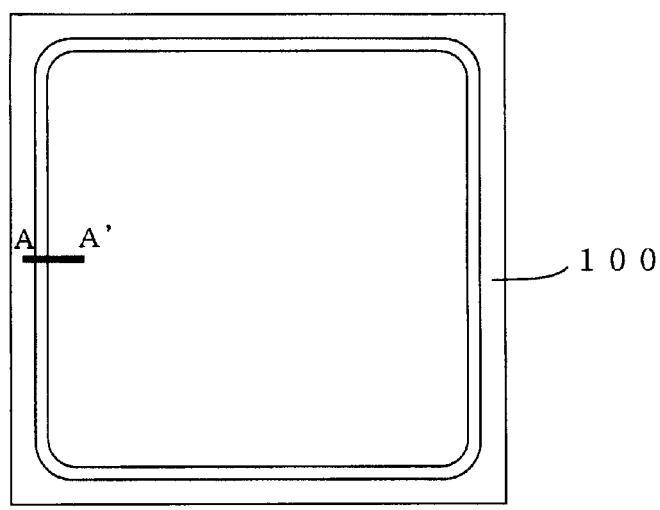
FIG. 2 illustrates a semiconductor chip wherein the semiconductor device shown in FIG. 1 is formed.

FIG. 1 is a cross-sectional view of the semiconductor device constructed in accordance with the first embodiment. FIG. 2 illustrates a semiconductor chip 100 wherein the semiconductor device shown in FIG. 1 is formed. As shown in FIG. 2, the semiconductor device constructed in accordance with the first embodiment is formed in an A-A' portion of the semiconductor chip 100 having a predetermined size.

As shown in FIG. 1, the semiconductor device comprises an active region portion and a current-resistant portion formed at an outer periphery of the active region portion. The active region portion is formed with an outermost switch structure and a repeating switch structure. The outermost switch structure is a first switch structure formed at an outermost portion of the active region portion and adjoined with the current-resistant structure. In the repeating switch structure, basic cells are repeatedly formed from a center of the semiconductor chip 100 toward the outermost switch structure as shown along line A' to A.

In the semiconductor device of the first embodiment shown in FIG. 1, three basic cells are formed. The basic cell includes a substrate region 1 defined by a semiconductor substrate and a drift region 2. The substrate region 1 is formed of an N-type high density (hereinafter, $N^+$-type) silicon carbide whose poly type is 4H. An $N^-$-type drift region 2 formed of an N-type low density (hereinafter, $N^-$-type) silicon carbide is formed on a surface of the substrate region 1.

The basic cell further includes a hetero semiconductor region 3 formed on predetermined areas of a surface of the drift region 2 opposite the substrate region 1. A gate insulation film 4 is formed on the surface of the drift region 2 not covered with the hetero semiconductor region 3 and on a partial surface and at least one side surface of the hetero semiconductor region 3 so as to be adjoined to the heterojunction of the drift region 2 and the hetero semiconductor region 3. A gate electrode 5 is formed adjacent to the gate insulation film 4. A source electrode 6 is directly connected to a source contact portion of the surface of the hetero semiconductor region 3, the source contact portions being the surface not covered with the gate insulation film. A drain electrode 7 is ohmic-connected to the surface of the substrate region 1 opposite the drift region in an electrically low resistance. Finally, an interlayer dielectric 8 insulates the gate electrode 5 from the source electrode 6.

Here, the hetero semiconductor region 3 of the basic cell is formed of N-type polycrystalline silicon having a band gap width different from the drift region 2 and hetero-adjoined with the drift region 2. Thus, an energy barrier is formed on the heterojunction interface of the drift region 2 and the hetero semiconductor region 3. The gate insulation film 4 is formed of a silicon oxide film. The source contact portion of the hetero semiconductor region 3 is a portion directly connected to the source electrode 6 of the hetero semiconductor region 3. The portion of the hetero semiconductor region 3 adjoined to the gate insulation film 4 is referred to as the heterojunction driving end of the heterojunction interface of the drift region 2 and the hetero semiconductor region 3.

The outermost switch structure has about the same structure as the basic cell. The difference between the outermost switch structure and the basic cell is merely that, instead of the hetero semiconductor region 3, an outermost periphery hetero semiconductor region 9 composed of $P^+$-type polycrystalline silicon is formed on a portion of the drift region 2 surface. The outermost periphery hetero semiconductor region 9 differs from the hetero semiconductor region 3 by its conductive-type of impurities or impurity density. However, the cross-sectional shape of the structures is equal to each other. Also, the outermost periphery hetero semiconductor region 9 and the hetero semiconductor region 3 have a symmetry in a cross-sectional structure of the semiconductor chip 100.

As will be explained below, the current flowing in the outermost switch structure is smaller than the current flowing in the basic cell. In the outermost switch structure, the source contact portion of the outermost periphery hetero semiconductor region 9 is the portion directly connected to the source electrode 6. Also, the portion contacting the gate insulation film 4 is referred to as the heterojunction driving end of the outermost periphery hetero semiconductor region 9 in the heterojunction interface of the drift region 2 and the outermost periphery hetero semiconductor region 9.

Figure 3A:
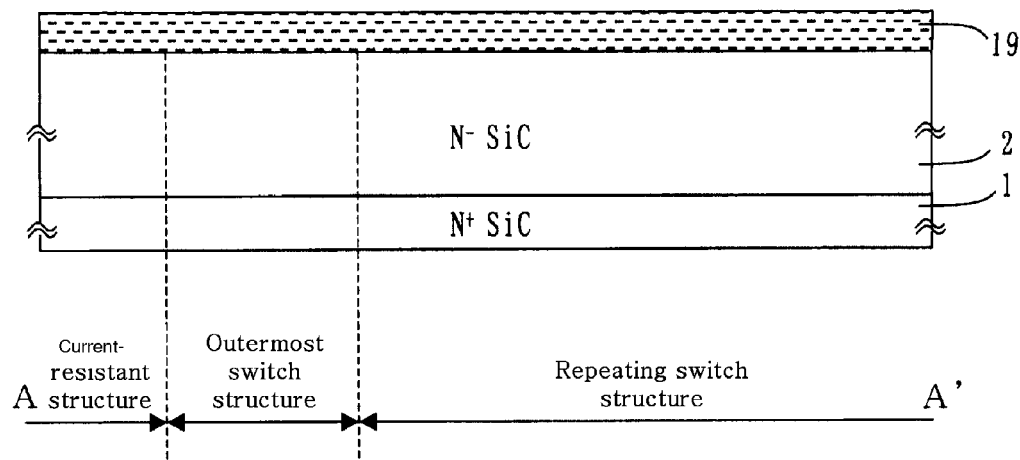
FIGS. 3A-3B are cross-sectional views of a method for manufacturing the semiconductor device shown in FIG. 1.
Figure 3B:
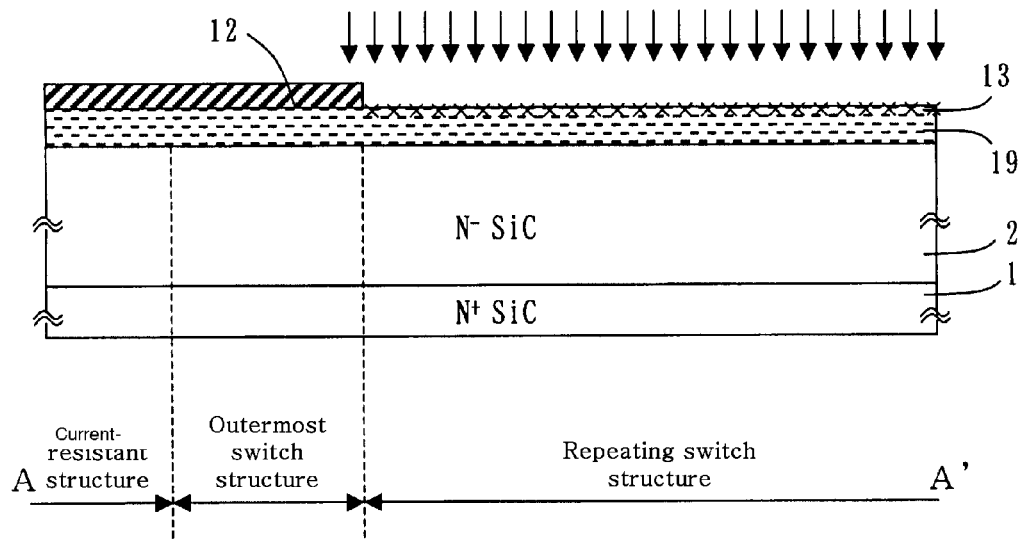

Next, a method of manufacturing the semiconductor device of the first embodiment is explained with reference to FIGS. 3 to 6, which are cross-sectional views of a method for manufacturing the semiconductor device shown in FIG. 1. First, as shown in FIG. 3A, an N-type silicon carbide semiconductor substrate is formed on the $N^+$-type substrate region 1 through the epitaxial growth of the $N^-$-type drift region 2. Next, a polycrystalline silicon layer 19, which is a hetero semiconductor layer, is formed on the N-type silicon carbide semiconductor substrate through, for example, LP-CVD process. Thereafter, as shown in FIG. 3B, a predetermined mask material 12 is formed on the polycrystalline silicon layer 19 through, for example, photolithography. Then, an N-type impurity implantation region 13, which is a second impurity implantation region, is formed by implanting impurities such as phosphor and arsenic through, for example, ion-implantation process in a portion except for the portion in the polycrystalline silicon layer 19 wherein the outermost periphery hetero semiconductor region 9 is formed.

Figure 4A:
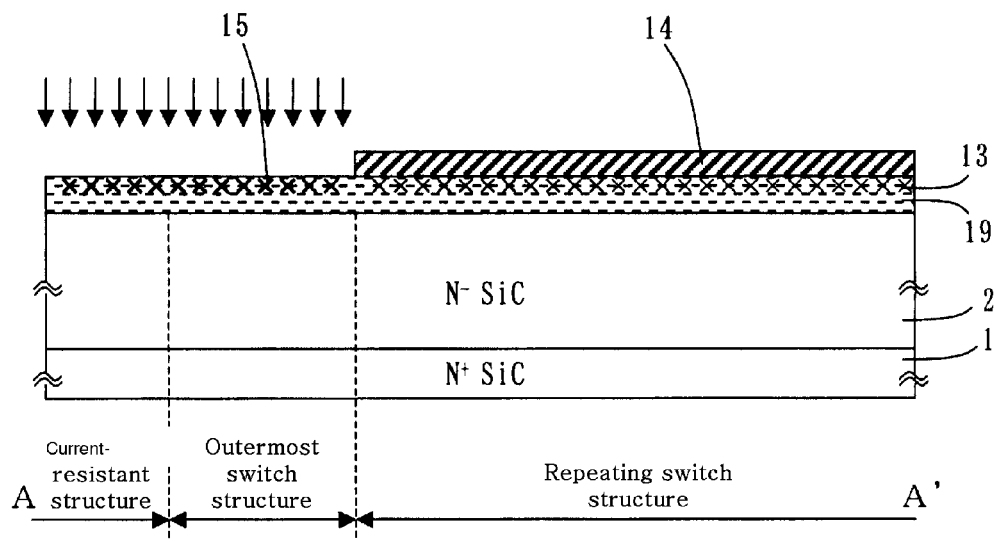
FIGS. 4A-4B are cross-sectional views of a method subsequent to that of FIG. 3B.

As shown in FIG. 4A, after removing the mask material 12, a predetermined mask material 14 is formed again on the polycrystalline silicon layer 19 through, for example, photolithography. Then, a P-type impurity implantation region 15, which is a first impurity implantation region, is formed by implanting impurity such as boron through, for example, ion-implantation process within the polycrystalline silicon layer 19 of the portion wherein the outermost periphery hetero semiconductor region 9 is formed.

Figure 4B:
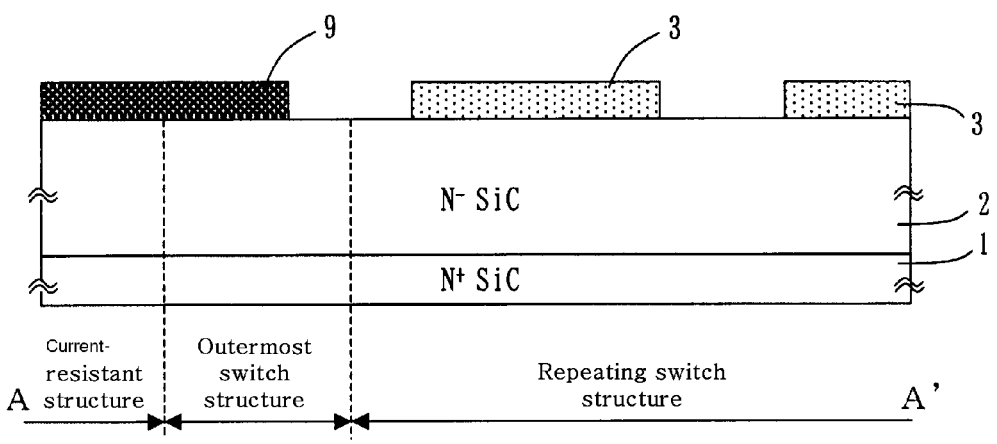

As shown in FIG. 4B, after removing the mask material 14, a predetermined mask material (not shown) is formed on the polycrystalline silicon layer 19 through, for example, photolithography. After the polycrystalline silicon layer 19 in which the mask material is opened is etched through, for example, reactive ion etching process (dry etching process), the mask material is removed and the impurities of the impurity implantation regions 13 and 14 are activated, thereby forming the N-type hetero semiconductor region 3 and the P-type outermost periphery hetero semiconductor region 9, respectively.

Figure 5:
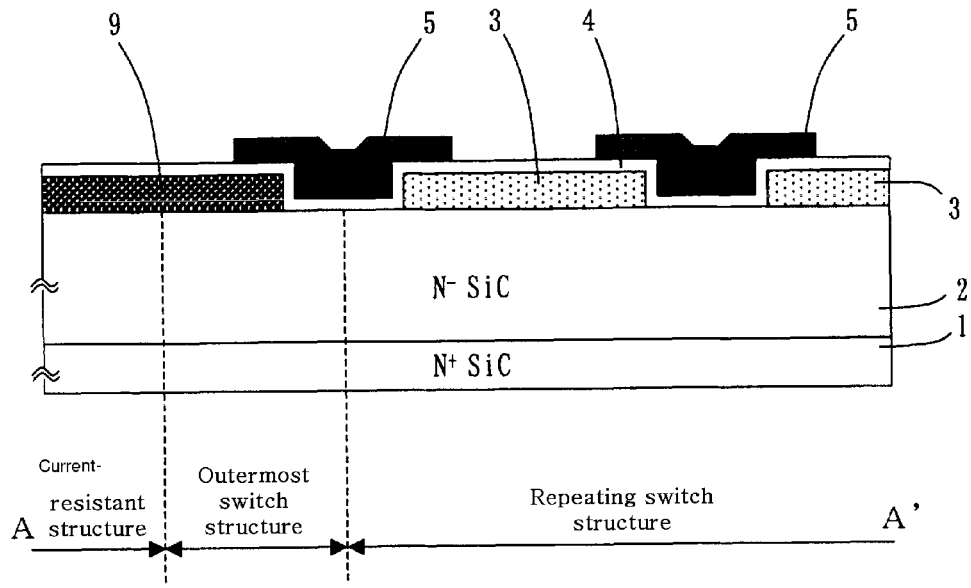
FIG. 5 is a cross-sectional view of a method subsequent to that of FIG. 4B.

Then, the gate insulation film 4 formed from the silicon oxide film through, for example, LP-CVD process and the polycrystalline silicon layer formed through, for example, LP-CVD process are deposited on the hetero semiconductor region 3, the outermost periphery hetero semiconductor region 9 and the exposed drift region 2 as shown in FIG. 5. Further, impurities such as phosphor or arsenic are implanted in the polycrystalline silicon layer through, for example, ion-implantation process and patterned by using a predetermined mask material (not shown) through, for example, dry etching process, thereby forming the N-type gate electrode 5.

Figure 6:
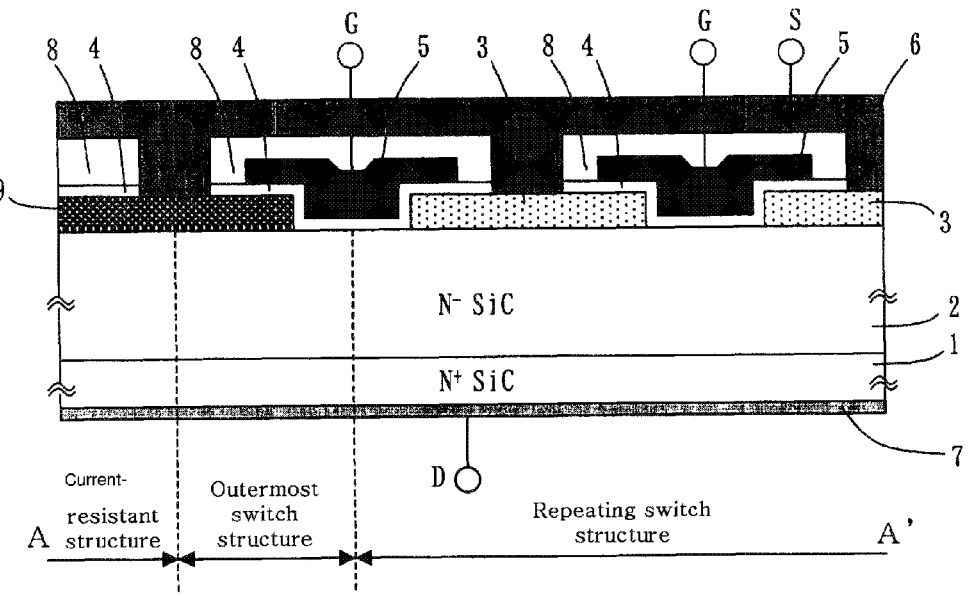
FIG. 6 is a cross-sectional view of a method subsequent to that of FIG. 5.

Finally, as shown in FIG. 6, an insulating layer is formed on the gate electrode 5 and the gate insulation film 4, the surface of which is exposed through, for example, CVD process. The interlayer dielectric 8 is formed by selectively etching and patterning the insulating layer through, for example, reactive ion etching process (dry etching process). Further, the source electrode 6 composed of, for example, titan (Ti) and aluminum (Al) is formed to contact a source contact portion of the hetero semiconductor region 3, the gate insulation film 4, a source contact portion of the outermost periphery hetero semiconductor region 9 and the interlayer dielectric 8. Also, the drain electrode 7 composed of for example, titan (Ti) and nickel (Ni) is formed on the back surface side of the substrate region 1, regardless of the order. By doing so, the semiconductor shown in FIG. 1, which is in accordance with the first embodiment, can be easily manufactured by combining general manufacturing processes.

Next, an operational theory of the semiconductor device constructed in accordance with the first embodiment is explained. In the semiconductor device, the source electrode 6 is grounded, and the positive electric potential is applied to the drain electrode 7. The gate electrode 5 is referred to as a grounded electric potential or a minus electric potential, for example. In this case, since an energy barrier for a conductive electron is formed on the heterojunction interface between the hetero semiconductor region 3 and the drift region 2 and the outermost periphery hetero semiconductor region 9 and the drift region 2, the semiconductor device maintains the interruption state.

In the current interruption state, a current leakage is generated at the heterojunction interface depending on the height of the energy barrier and an intensity of the drain electric field. However, since the $P^+$-type outermost periphery hetero semiconductor region 9 is formed on the outermost switch structure, a height of the energy barrier of the outermost periphery hetero semiconductor region 9 becomes higher than a height of the energy barrier of the N-type hetero semiconductor region 3. In the interruption state, the leak current due to an electric field concentration of the drain electric field is increased in the conventional semiconductor chip where the basic cell is formed on the outermost portion. However, in the disclosed embodiment, since the $P^+$-type outermost periphery hetero semiconductor region 9 is formed in the semiconductor chip 100, the leak current can be reduced. In other words, the interrupting performance is improved.

To shift from the interruption state to the conduction state, a positive electric potential is applied to the gate electrode 5 and a deposition layer of electrons is formed on an outer layer portion of the drift region 2 and a heterojunction driving end of the hetero semiconductor region 3. In the hetero semiconductor region 3 and the outer layer portion of the drift region 2, the electric potential becomes a potential in which a free electron can exist. The energy barrier stretching toward the drift region 2 side becomes inclined. Accordingly, the energy barrier thins, and an electron current is conducted.

In the conduction state of the basic cell, since the outermost periphery hetero semiconductor region 9 is a $P^+$-type, the electron current hardly flows even when the gate electric field extends from the gate electrode 5 via the gate insulation film 4. In the semiconductor chip 100, most of the current flowing in the conduction state evenly flows in the basic cells arranged in parallel. Thus, a portion with concentrated current is avoided.

To shift from the conduction state to the interruption state, the gate electrode 5 is allowed to be a grounded electric potential again, the deposition state of the conductive electron formed in the heterojunction driving end of the hetero semiconductor region 3 and the outer layer portion of the drift region 2 is released, and a tunneling operation within the energy barrier stops. When flow of the conductive electron from the hetero semiconductor region 3 to the drift region 2 stops, and the conductive electron within the drift region 2 flows to the substrate region 1, a depletion layer of the drift region 2 side expands from the heterojunction, becoming an interruption state.

In the semiconductor device of the first embodiment, a reverse conducting operation (a back-flow operation) is possible wherein the source electrode 6 is grounded and the minus electric potential is applied to the drain electrode 7. For example, when the source electrode 6 and the gate electrode 5 are allowed to be grounded electric potentials and a predetermined minus electric potential is applied to the drain electrode 7, the energy barrier for the conductive electron vanishes, and the conductive electron flows from the drift region 2 side to the hetero semiconductor region 3 side, thereby becoming a reverse conduction state. Because an electron hole is not injected and is only conducted via the conductive electron, a loss caused by a reverse recovery current when shifting from the reverse conduction state to the interruption state is small. Further, in the reverse conduction state, since the heights of the energy barriers of the outermost periphery hetero semiconductor region 9 and the drift region 2 are higher than heights of the hetero semiconductor region 3 and the drift region 2 in the outermost switch structure, the flowing electronic current is small. In the semiconductor chip 100, most of the current flowing in the reverse conduction state evenly flows in the basic cells arranged in parallel, and a portion of concentrated current is avoided. Optionally, the gate electrode 5 may be used as a control electrode without being grounded.

With the use of the semiconductor device in accordance with the first embodiment, rather than simply arranging the basic cells on the semiconductor chip, in both the conduction state and the reverse conduction state the current hardly flows in the outermost switch structure formed at the outermost portion of the active region portion. Therefore, most of the current flowing in the semiconductor chip 100 evenly flows in the basic cells arranged in parallel. Occurrences where the current density of the outermost switch structure becomes higher than the current density of the basic cell can be prevented, thereby preventing the concentration of the current in that region. Deterioration of the outermost switch structure due to the concentration of the current is prevented, and the long-term reliability of the device is improved.

When using the semiconductor chip 100 in an L-load circuit, an overcurrent or overvoltage may be generated at the time of a transient response when shifting from an interruption state to a conduction state and at the time of a transient response when shifting from the conduction state to the interruption state. The semiconductor chip 100 will have a low resistance load, a low avalanche resistance and a low destruction resistance against the overcurrent and overvoltage. However, unlike the prior art, occurrences of generating high current density in the outermost switch structure can be avoided, thus avoiding concentration of the current to the outermost switch structure. As such, the destruction resistance of the semiconductor chip 100 is increased. Further, in the interruption state, since the P-type outermost periphery hetero semiconductor region 9 is arranged at the outermost portion where the drain electric field concentrates, it is possible to easily reduce the leak current in the semiconductor chip 100.

Next, a semiconductor device constructed in accordance with a second embodiment is explained with reference to FIGS. 7 to 10, while focusing on the points that differ from the semiconductor device of the first embodiment. Further, the features of the semiconductor device according to the second embodiment that are the same as those according to the first embodiment are denoted by the same reference numerals. Thus, their explanations are omitted herein.

Figure 7:
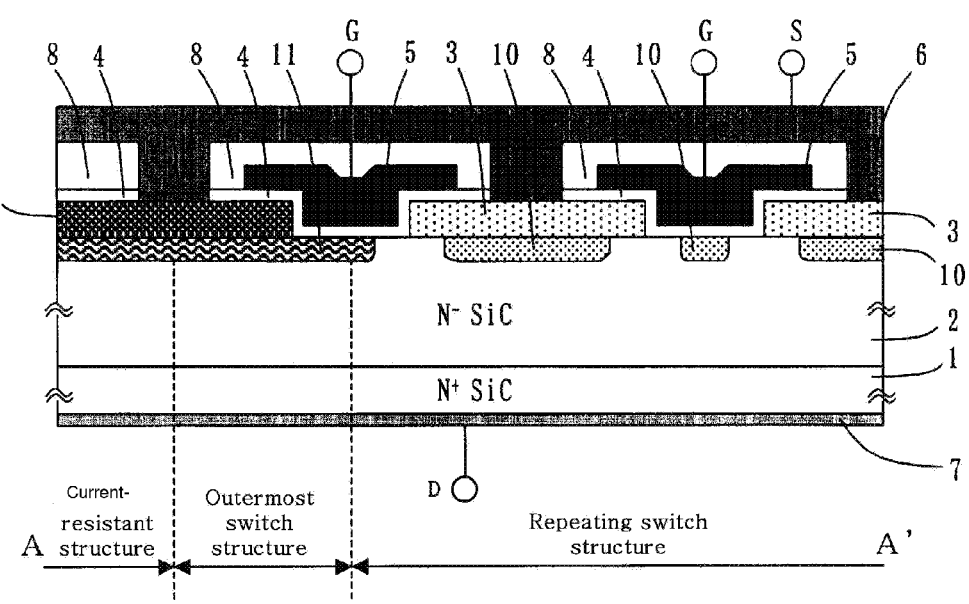
FIG. 7 is a cross-sectional view of a semiconductor device constructed in accordance with a second embodiment of the invention.

FIG. 7 is a cross-sectional view of a semiconductor device constructed in accordance with a second embodiment. As shown in FIG. 7, the semiconductor device of the second embodiment is similar to that of the first embodiment, but differs therefrom in that it further comprises an electric field alleviation region 10. This electric field alleviation region 10 is adjoined to portions of the drift region 2, the hetero semiconductor region 3 and the gate insulation film 4 of the basic cells that are repeatedly formed in the repeating switch structure. An outermost periphery electric field alleviation region 11 is adjoined to the drift region 2 and the gate insulation film 4 of the outermost periphery hetero semiconductor region 9 of the outermost switch structure. The outermost periphery electric field alleviation region 11 is not adjoined to the heterojunction driving end of the hetero semiconductor region 3 of the basic cell. With this design, the same effects as in the first embodiment are achieved.

Because the electrical field alleviation region 10 is formed in the basic cell, the drain electric field to the heterojunction of the hetero semiconductor region 3 and the drift region 2 is alleviated during the interruption state. The leak current flowing in the basic cell is reduced. However, in the conduction state, the gate electric field strength from the gate electrode 5 to the heterojunction driving end is not reduced. Thus, in the basic cell of the semiconductor device according to the second embodiment, the electric field alleviation region 10 and the outermost periphery electric field alleviation region 11 are formed at a portion spaced in a predetermined distance apart from the heterojunction driving end of the hetero semiconductor region 3, as seen in FIG. 7. Since the outermost periphery electric field alleviation region 11 is formed at the outermost periphery hetero semiconductor region 9 of the outermost switch structure, when in the interruption state the drain electric field to the heterojunction of the outermost periphery hetero semiconductor region 9 and the drift region 2 is alleviated. Accordingly, the leak current flowing in the outermost switch structure is reduced.

Because the outermost periphery electrical field alleviation region 11 is adjoined to the heterojunction driving end of the outermost periphery hetero semiconductor region 9, when in the conduction state the gate electric field to the heterojunction of the outermost periphery hetero semiconductor region 9 and the drift region 2 is alleviated. The gate electrode strength of the heterojunction driving end of the outermost periphery hetero semiconductor region 9 of the outermost switch structure becomes smaller than the gate electric field strength of the heterojunction driving end of the hetero semiconductor region 3 of the basic cell. A current driving power in the heterojunction driving end of the outermost periphery hetero semiconductor region 9 becomes smaller than that of the heterojunction driving end of the hetero semiconductor region 3. Therefore, in the conduction state, the current of the outermost periphery switch structure will hardly flow, regardless of the conductive type or concentration of the impurities in the outermost periphery hetero semiconductor region 9.

Figure 8A:
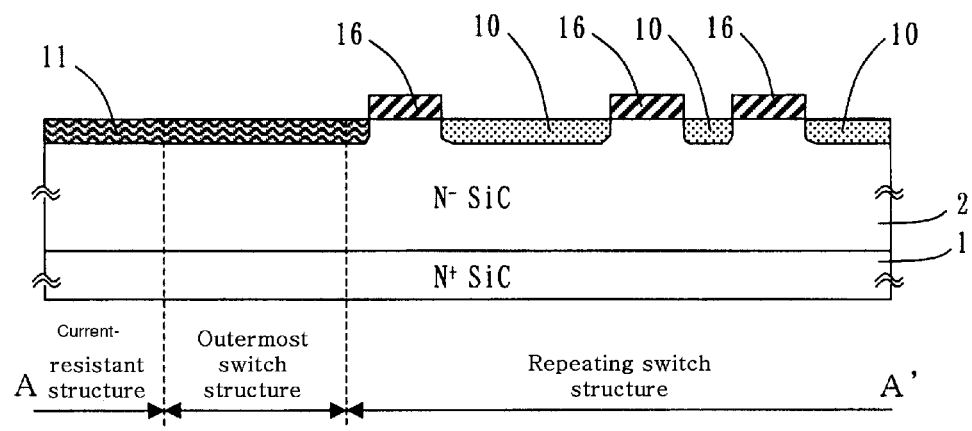
FIGS. 8A-8B are cross-sectional views of a method for manufacturing the semiconductor device shown in FIG. 7.
Figure 8B:
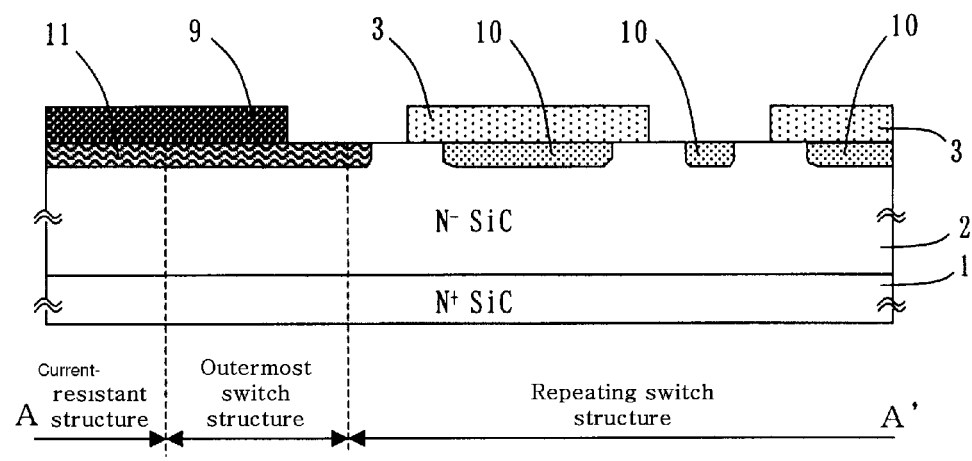
Figure 9:
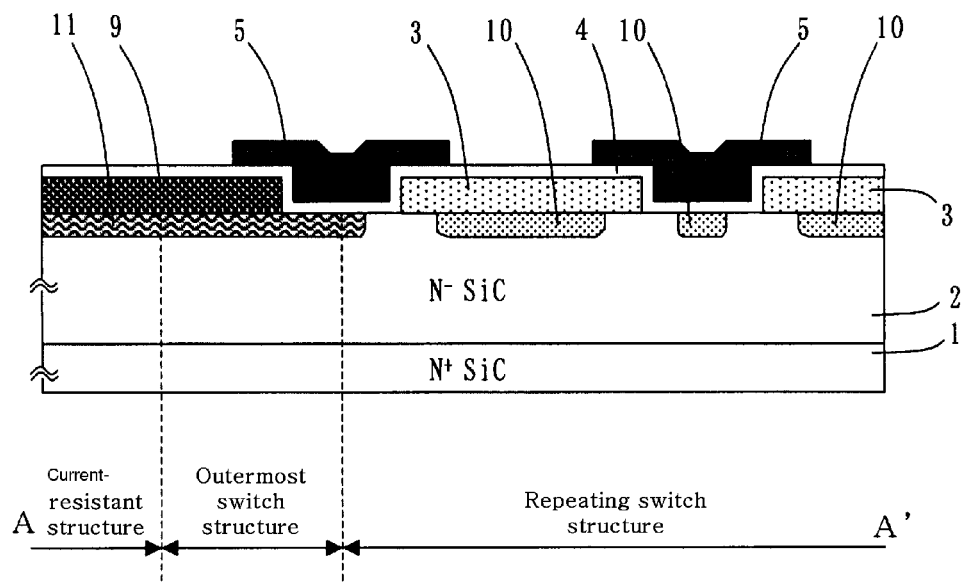
FIG. 9 is a cross-sectional view of a method subsequent to that of FIG. 8B.
Figure 10:
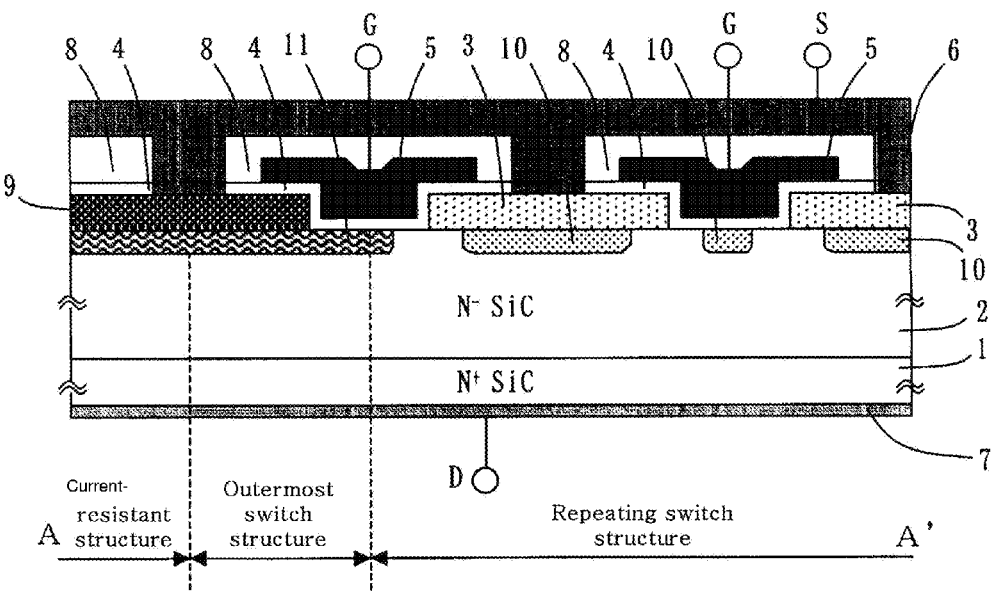
FIG. 10 is a cross-sectional view of a method subsequent to that of FIG. 9.

Next, a method of manufacturing the semiconductor device according to the second embodiment will be explained with reference to FIGS. 8 to 10. FIGS. 8 to 10 are cross-sectional views of a method for manufacturing the semiconductor device shown in FIG. 7. First, as shown in FIG. 8A, an N-type silicon carbide semiconductor substrate is formed on the $N^+$-type substrate region 1 through the epitaxial growth of the $N^-$-type drift region 2. Then, the electric field alleviation region 10 and the outermost periphery electric field alleviation region 11 are formed by forming a predetermined mask material 16 on the N-type silicon carbide semiconductor substrate through, for example, photolithography and implanting the impurities such as aluminum or boron into the drift region 2 through, for example, ion-implantation process. Further, the electric field alleviation region 10 and the outermost periphery electric field alleviation region 11 are equally formed. However, they may be formed differently.

Next and similar to the first embodiment, the N-type impurity implantation region 13 is formed by forming the polycrystalline silicon layer 19 through, for example, a LP-CVD process, forming the predetermined mask material 12 on the polycrystalline silicon layer 19 through, for example, photolithography and implanting phosphorus or boron through, for example, an ion-implantation process, into the polycrystalline silicon layer 19 except for the portion wherein the outermost periphery hetero semiconductor region 9 is formed, (See FIG. 3). Also similar to the first embodiment, the P-type impurity implantation region 15 is next formed by forming the predetermined mask material 14 on the polycrystalline silicon layer 19 through, for example, photolithography after removing the mask material 12 and implanting boron through, for example, ion-implantation process within the polycrystalline silicon layer 19 wherein the outermost periphery hetero semiconductor region 9 is formed. (See FIG. 4). Next, as shown in FIG. 8B, after removing the mask material 14, a predetermined mask material (not shown) is formed on the polycrystalline silicon layer 19 through, for example, photolithography. After the polycrystalline silicon layer 19 wherein the mask material is opened is etched through, for example, reactive ion etching process (dry etching process), the mask material is removed, and the N-type hetero semiconductor region 3 and the P-type outermost periphery hetero semiconductor region 9 are formed.

As shown in FIG. 9, the gate insulation film 4 formed from the silicon oxide film through, for example, a LP-CVD process and the polycrystalline silicon layer formed through, for example, LP-CVD process are deposited on the hetero semiconductor region 3, the outermost periphery hetero semiconductor region 9, the electric field alleviation region 10, the outermost periphery electric field alleviation region 11 and the exposed drift region 2. Further, impurities such as phosphor or arsenic are implanted in the polycrystalline silicon layer through, for example, ion-implantation process and patterned by using a predetermined mask material (not shown) through, for example, dry etching process, thereby forming the N-type gate electrode 5. Finally, as shown in FIG. 10, an insulation film is formed on the gate electrode 5 and the gate insulation film 4 whose surface is exposed through, for example, CVD process, and the interlayer dielectric 8 is formed through selectively etching and patterning through, for example, reactive ion etching process (dry etching process). Further, the source electrode 6 composed of, for example, titanium (Ti) and aluminum (Al) is formed to contact a source contact portion of the hetero semiconductor region 3, the gate insulation film 4, a source contact portion of the outermost periphery hetero semiconductor region 9 and the interlayer dielectric 8. Also, the drain electrode 7 composed of, for example, titanium (Ti) and nickel (Ni) is formed on the other surface side of the substrate region 1, regardless of the order. By doing so, the semiconductor shown in FIG. 7, which is constructed in accordance with the second embodiment, can be easily manufactured by combining general manufacturing processes.

A semiconductor device constructed in accordance with a third embodiment is next explained with reference to FIGS. 11 to 14, while focusing on the points that differ from the semiconductor device of the first embodiment. The features in the semiconductor device of the third embodiment that are the same as the semiconductor device of the first embodiment are denoted by the same reference numerals. Thus, their explanations are omitted herein.

Figure 11:
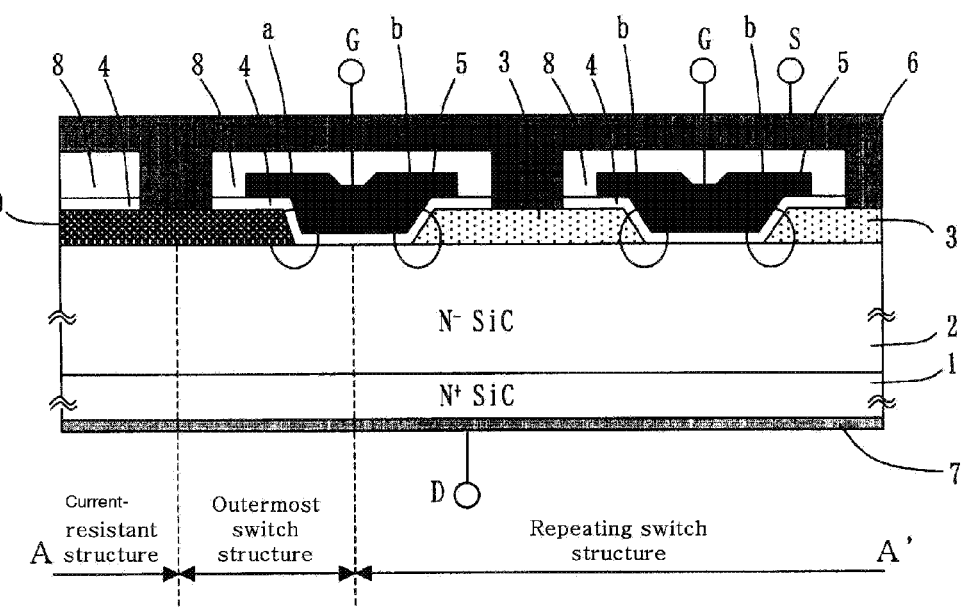
FIG. 11 is a cross-sectional view of a semiconductor device constructed in accordance with a third embodiment of the invention.

FIG. 11 is a cross-sectional view of the third embodiment. As shown in FIG. 11, the semiconductor device of the third embodiment has similar features to the semiconductor device of the first embodiment. The semiconductor device of the third embodiment differs from that of the first embodiment in that an inclined angle "a" is formed in the heterojunction driving end of the outermost periphery hetero semiconductor region 9 of the outermost switch structure, and an inclined angle "b" is formed in the heterojunction driving end of the hetero semiconductor region 3 of the basic cell. The inclined angle "a" should be larger than the inclined angle "b." Therefore, the same improvements seen in the first embodiment are achieved. In a conduction state, the strength of the gate electric field applied from the gate electrode becomes stronger as the inclined angle of the heterojunction driving end becomes smaller. As such, the strength becomes weaker as the inclined angle of the heterojunction driving end becomes larger By adopting this feature, the gate electric field strength of the heterojunction driving end of the outermost periphery hetero semiconductor region 9 becomes smaller than the gate electric field strength of the heterojunction driving end of the hetero semiconductor region 3. This causes a current driving power in the outermost periphery hetero semiconductor region end to become smaller than that of the hetero semiconductor region end. Therefore, regardless of the conductive type or concentration of the impurities in the outermost periphery hetero semiconductor region 9, in the conduction state, the current of the outermost periphery switch structure is limited.

Figure 12A:
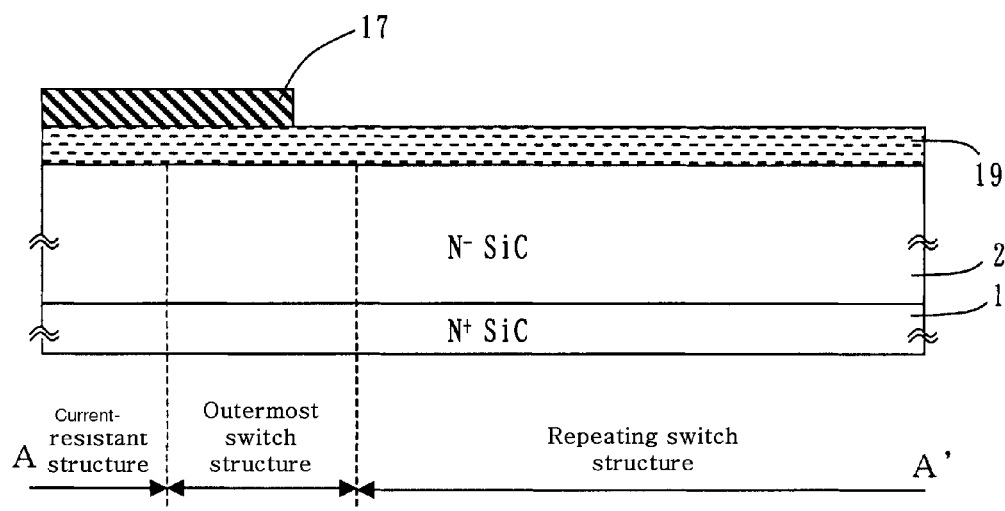
FIGS. 12A-12B are cross-sectional views of a method for manufacturing the semiconductor device shown in FIG. 11.
Figure 13:
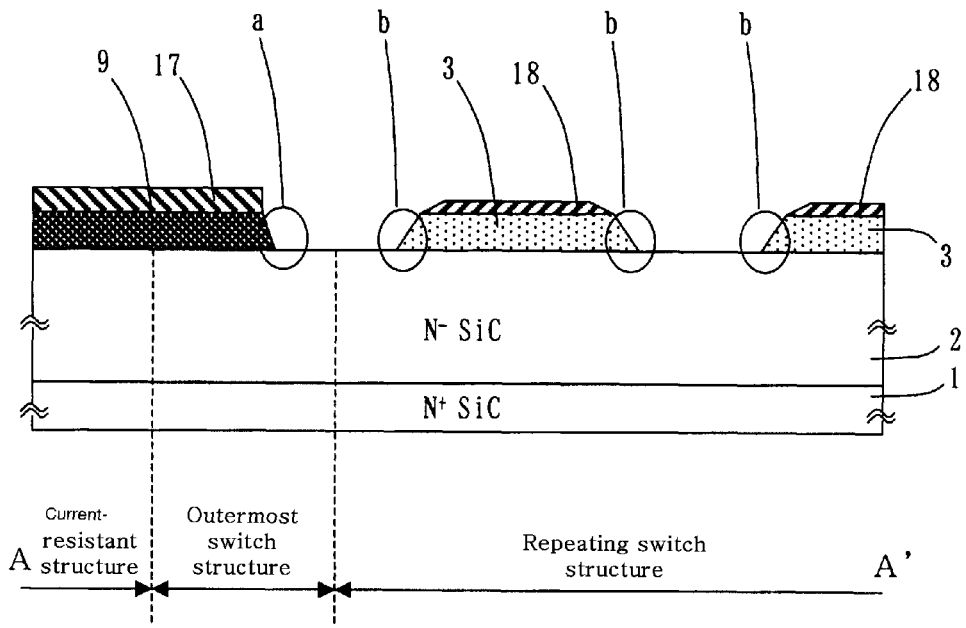
FIG. 13 is a cross-sectional view of a method subsequent to that of FIG. 12B.
Figure 14:
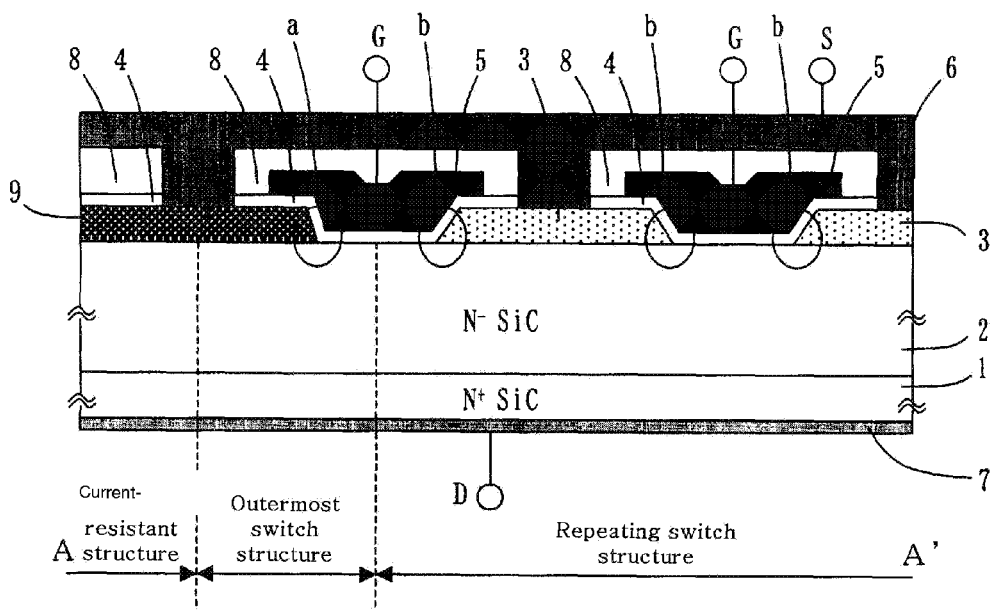
FIG. 14 is a cross-sectional view of a method subsequent to that of FIG. 13.

A method of manufacturing the semiconductor device constructed in accordance with the third embodiment is next explained with reference to FIGS. 12 to 14. FIGS. 12 to 14 are cross-sectional views of the method for manufacturing the semiconductor device shown in FIG. 11. First, as shown in FIG. 12A, the N-type silicon carbide semiconductor substrate is formed on the N$^+$-type substrate region 1 through the epitaxial growth of the N$^-$-type drift region 2. Then, the polycrystalline silicon layer 19 is formed on the N-type silicon carbide semiconductor substrate through, for example, a LP-CVD process. Thereafter, similar to the first embodiment, the N-type impurity implantation region 13 is formed by forming the predetermined mask material 12 on the polycrystalline silicon layer 19 through, for example, photolithography and implanting phosphorus or boron through, for example, ion-implantation process, into the polycrystalline silicon layer 19 except for the portion wherein the outermost periphery hetero semiconductor region 9 is formed. (See FIG. 3).

Also similar to the first embodiment the P-type impurity implantation region 15 is formed by forming the predetermined mask material 14 on the polycrystalline silicon layer 19 through, for example, photolithography after removing the mask material 12, and implanting boron through, for example, ion-implantation process within the polycrystalline silicon layer 19 wherein the outermost periphery hetero semiconductor region 9 is formed. (See FIG. 4). Thereafter, a predetermined mask material 17 composed of, for example, SiO$_2$ film is formed on the polycrystalline silicon layer 19 in the portion wherein the outermost periphery hetero semiconductor region 9.

Figure 12B:
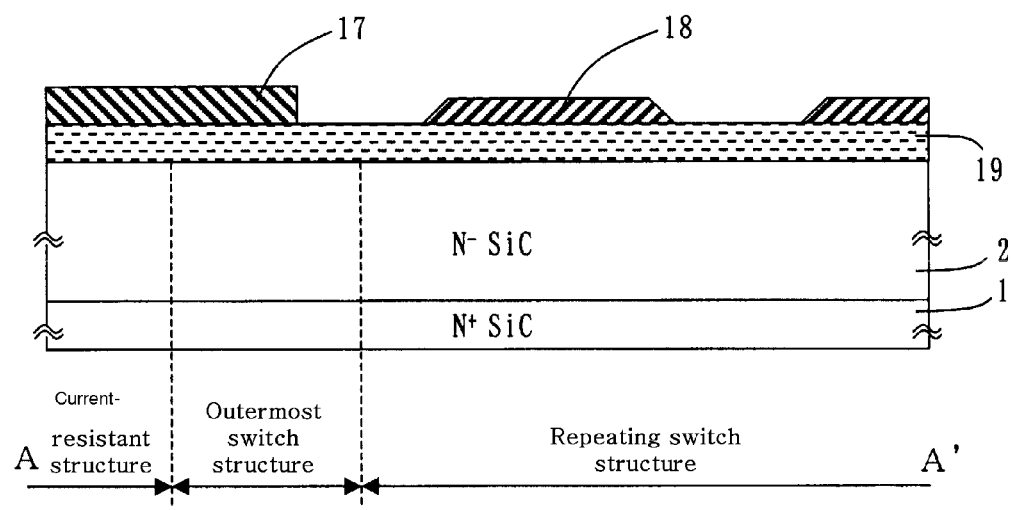

As shown in FIG. 12B, a predetermined mask material 18 is formed through, for example, photolithography on the polycrystalline silicon layer 19 in the portion wherein the hetero semiconductor region 3 is formed. In a process shown in FIG. 12B, the inclined angle "b" formed in the hetero semiconductor region end and the inclined angle "a" formed in the outermost periphery hetero semiconductor region end can be controlled by controlling the thickness or inclined angle of the mask material 18. Next, the polycrystalline silicon layer 19 wherein the mask materials 17 and 18 are opened is etched through, for example, reactive ion etching process (dry etching process) as shown in FIG. 13. The mask materials 17 and 18 are removed, and the N-type hetero semiconductor region 3 and the P-type outermost periphery hetero semiconductor region 9 are formed, respectively. In a process shown in FIG. 13, a retracting distance of the mask materials 17 and 18 can be controlled by an etching ratio of the mask materials 17 and 18 and the inclined angle of the mask materials 17 and 18 themselves. That is, as shown in FIG. 13, the inclined angle "a" of the outermost periphery hetero semiconductor region end may be larger than the inclined angle "b" of the hetero semiconductor region end.

Finally, as shown in FIG. 14 and similar to the first and second embodiments, the gate insulation film 4 formed of the silicon oxide film through, for example, a LP-CVD process and the polycrystalline silicon layer formed through, for example, a LP-CVD process are deposited on the hetero semiconductor region 3, the outermost periphery hetero semiconductor region 9, the electric field alleviation region 10, the outermost periphery electric field alleviation region 11 and the exposed drift region 2. Further, impurities such as phosphor or arsenic are implanted in the polycrystalline silicon layer through, for example, ion-implantation process and patterned by using a predetermined mask material (not shown) through, for example, a dry etching process, thereby forming the N-type gate electrode 5.

An insulation film is formed on the gate electrode 5 and the gate insulation film 4 whose surface is exposed through, for example, a CVD process. Then, the interlayer dielectric 8 is formed through selectively etching and patterning through, for example, reactive ion etching process (dry etching process). Further, the source electrode 6 composed of, for example, titanium (Ti) and aluminum (Al) is formed to contact a source contact portion of the hetero semiconductor region 3, the gate insulation film 4, a source contact portion of the outermost periphery hetero semiconductor region 9 and the interlayer dielectric 8. Also, the drain electrode 7 composed of, for example, titanium (Ti) and nickel (Ni) is formed on the other surface side of the substrate region 1, regardless of the order. By doing so, the semiconductor shown in FIG. 11, which is constructed in accordance with the third embodiment, can be easily manufactured by combining general manufacturing processes.

While certain embodiments of the invention are described herein, it should be noted that the invention may include other embodiments and modifications without deviating from the subject matter or scope of the invention. As long as the current flowing in the outermost switch structure in the conduction state becomes smaller than the current flowing in the basic cell, the same effects can be achieved even if further structures are added as a semiconductor device or the device is modified.

For example, in the semiconductor device of the first to third embodiments, a longitudinal transistor may be interposed between the source electrode 6 and drain electrode 7, and the current flows in a longitudinal direction. A lateral transistor may be disposed on the same surface as the drain electrode 7 and source electrode 6, and the current can flow in a lateral direction. In the semiconductor device according to the first and second embodiments, the hetero semiconductor region end and the outermost periphery hetero semiconductor region end may be formed in a vertical shape, an acute angle shape or an obtuse angle shape. In the first to third embodiments, the planar type transistor is disclosed wherein the drift region 2 is not trenched, but the gate electrode is formed. However, it is beneficial to employ the so-called trench type transistor wherein the drift region 2 is trenched.

The semiconductor device of the first to third embodiments comprises the repeating switch structure wherein three basic cells are repeatedly formed; however, the number of basic cells is certainly not limited thereto. One inventive feature of the invention resides in the outermost switch structure formed at the outermost portion of the semiconductor chip 100. However, in a device comprising a plurality of repeating portion switch structures with a plurality of switch structures, the same effects can be achieved so long as the repeating switch structure is at least an end which is cut off halfway.

In the semiconductor device constructed in accordance with the first to third embodiments, the semiconductor substrate 1 and the drift region 2 are formed of silicon carbide; however, the invention is certainly not limited to this configuration. The semiconductor device may be formed of other semiconductor materials such as gallium nitride, diamond and the like. Also, in the first to third embodiments, it is described that a poly type of the silicon carbide is 4H; however, the poly type of the semiconductor region 1 may be 6H, 3C and the like.

In the semiconductor device constructed in accordance with the first to third embodiments, the first hetero semiconductor region 3 and the outermost periphery hetero semiconductor region 9 are formed from polycrystalline silicon. However, the invention is certainly not limited thereby. Any material that can be hetero-adjoined with silicon carbide may be used. For example, other silicon materials such as monocrystalline silicon and amorphous silicon, or other semiconductor materials such as germanium and silicon germanium, or silicon carbide of other poly types such as 6H and 3C may be used.

In the semiconductor device described, the drift region 2 is formed from the N-type silicon carbide and the hetero semiconductor region 3 is formed from the N-type polycrystalline silicon. However, any combination of the N-type silicon carbide, P-type polycrystalline silicon, P-type silicon carbide, P-type poly crystalline silicon, P-type silicon carbide, N-type polycrystalline silicon may be possible. In the embodiments, the gate electrode 5 is formed by using the polycrystalline silicon. However, any material other than the polycrystalline silicon may be used so long as it serves as the gate electrode 5 with high conductive property.

Further, the gate electrode 5 and the outermost periphery hetero semiconductor region 9 are formed from polycrystalline silicon. However, the gate electrode 5 and the outermost periphery hetero semiconductor region 9 may be formed from mono-crystalline silicon via hetero epitaxial growth using molecular beam epitaxy.

In the disclosed semiconductor device embodiments, the photoresist is used for the mask material 12, 14; however, the mask material may be other materials such as $SiO_2$ film or SiN film. The gate insulation film 4 is formed from the silicon oxide film in the embodiments; however, any materials having an insulation property such as SiN may be used for the gate insulation film.

Although the material of the interlayer dielectric 8 is not explained in the semiconductor device according to the first to third embodiments, the interlayer dielectric 8 may be formed from any material so long as it has at least an insulation property such as silicon oxide film or SiN film. Further, the hetero semiconductor region 3 and the outermost periphery hetero semiconductor region 9 are explained with respect to a single impurity concentration. However, the hetero semiconductor region 3 and the outermost periphery hetero semiconductor region 9 may have a plurality of impurity concentrations or a plurality of conductive types.

Also, in the methods of manufacturing semiconductor devices taught herein, the polycrystalline silicon layer is formed through the LP-CVD process. However, it should be noted that the present invention is certainly not limited to this configuration. That is, the N-type hetero semiconductor region 3 may be formed through a laser annealing process after the polycrystalline silicon layer is formed through an electron beam deposition process or a sputtering process.

Further, in the methods described herein, the gate insulation film 4 is formed through the LP-CVD process. However, it should be noted that the invention is certainly not limited to such a configuration. That is, it may include any process such as thermal oxidizing process or plasma CVD process.

Also, a dry etching process is used for etching the polycrystalline silicon layer 19 in the methods described herein. However, it should be noted that the invention is certainly not limited to such a configuration. That is, for example, a process of removing the oxide film through the wet etching process with a mixture solution of ammonium fluoride and fluorinated acid after oxidizing through the wet etching process or thermal oxidizing process may be adopted. Further, a process of combining the wet etching process and the thermal oxidizing process may be adopted.

In addition, although it is not explained in the methods of manufacturing described thus far, after etching the polycrystalline silicon layer 19, a sacrificial oxidizing process or an oxide film removal may be performed. In such a case, the sacrificial oxidizing process may be performed after the dry etching process. Further, the formation of the N-type impurity implantation region 13 and the P-type impurity implantation region 15 through the ion-implantation process and heat treatment such as the sacrificial oxidizing process after the dry etching process are combined. By doing so, the implanted impurity is activated after the hetero semiconductor region 3 and the outermost periphery hetero semiconductor region 9 become separate structures. Thus, even when a distance between the hetero semiconductor region 3 and the outermost periphery hetero semiconductor region 9 is small, an impurity distribution can be easily separated.

Also, in the methods of manufacturing the semiconductor device according to the first to third embodiments, the polycrystalline silicon layer is patterned through the dry etching process so as to form the gate electrode 5. However, it should be noted that the present invention is certainly not limited to such a configuration. That is, the polycrystalline silicon layer may be patterned through the wet etching process.

Further, the impurity is implanted through an ion-implantation process in the methods described herein; however, the impurity may be implanted through a solid-phase diffusion or gas-phase diffusion.

As described in the methods herein, when the N-type impurity implantation region 13 and the P-type impurity implantation region 15 are formed in the polycrystalline silicon layer 19, the mask materials 12 and 24 are formed. However, the invention is not limited to such a configuration. For example, if there is a difference in the impurity concentration between the N-type impurity implantation region 13 and the P-type impurity implantation region 15, then the impurity may be implanted into a front surface of the polycrystalline silicon layer 19 with regard to the region with low impurity concentration. Further, only the region with high impurity concentration may be selectively formed by using the mask material.

Disclosed is an outermost periphery hetero semiconductor region 9 of the P$^+$-type in the semiconductor device according to the first to third embodiments. However, the invention is certainly not limited to this configuration. In the conductor state, a switch structure may be adopted wherein at least a part of the current course becomes a P$^-$-type, an N$^-$-type or non-impurity doping intrinsic layer.

Even when the impurity concentration of the outermost periphery hetero semiconductor region 9 of the outermost switch structure is lower than the hetero semiconductor region 3 of the basic cell, the energy barrier heights of the outermost periphery hetero semiconductor region 9 and the drift region 2 become higher than the energy barrier heights of the hetero semiconductor region 3 and the drift region 2. Further, at least in the conduction state, the resistance in the accumulating layer or the inversion layer becomes higher. Accordingly, the same effects are achieved.

In the semiconductor device according to the first to third embodiments, in the outermost switch structure, the same P$^+$-type outermost periphery hetero semiconductor region 9 is formed. However, any constitution can achieve the same effects so long as the current is not concentrated into the outermost periphery switch structure. In view of reducing the current in the conduction state, the resistance to the source contact portion from the heterojunction driving end of the outermost periphery hetero semiconductor region 9 may be larger than the resistance to the source contact portion from the heterojunction driving end of the hetero semiconductor region 3 of the basic cell. Specifically, the resistance may be increased by increasing a distance between the source contact portion of the outermost periphery hetero semiconductor region 9 and its heterojunction driving end. Also, the resistance may be increased by decreasing the thickness of the entire outermost periphery hetero semiconductor region 9 or a predetermined portion thereof.

In the second and third embodiments, the electric field alleviation region 10 and the outermost periphery electric field alleviation region 11 may be combined. Alternatively, the inclined angle "a" of the outermost periphery hetero semiconductor region end may be combined. The electric field alleviation region 10 and the outermost periphery electric field alleviation region 11 are formed by implanting the impurities such as aluminum or boron through the ion-implantation process into the drift region 2. However, the electric field alleviation region 10 and the outermost periphery electric field alleviation region 11 may be formed of a high resistance region structure without performing an activation heat treatment of the impurities. Further, for example, after removing the mask material 16, the electric field alleviation region 10 and the outermost periphery electric field alleviation region 11 may be formed of a P-type SiC region structure by performing the activation heat treatment, for example, at 1000° C. to 2000° C.

In the semiconductor device according to the second embodiment, the P$^+$-type outermost periphery hetero semiconductor region 9 is formed. However, the invention is not limited to such a configuration. Any conductive type of the impurity or impurity concentration of the outermost periphery hetero semiconductor region 9 may be adopted.

In the second embodiment, the electric field alleviation region 10, which is not adjoined to the heterojunction driving end of the hetero semiconductor region 3, is formed in the basic cell. The outermost electric field alleviation region 11 is formed in the outermost switch structure such that the outermost electric field alleviation region 11 is adjoined to the heterojunction driving end of the outermost periphery hetero semiconductor region 9 while not adjoining the heterojunction driving end of the hetero semiconductor region 3 of the basic cell. By doing so, the gate electric field strength of the heterojunction driving end of the outermost periphery hetero semiconductor region 9 of the outermost periphery switch structure is less than the gate electric field strength of the heterojunction driving end of the hetero semiconductor region 3 of the basic cell. However, the invention is certainly not limited to such a configuration. Any structure can achieve the same effects so long as it is capable of allowing the gate electric field strength of the heterojunction driving end of the outermost periphery hetero semiconductor region 9 to be less than the gate electric field strength of the heterojunction driving end of the hetero semiconductor region 3.

Likewise, in the semiconductor device according to the third embodiment, the inclined angle "a" of the outermost periphery hetero semiconductor region end is formed to be greater than the inclined angle "b" of the hetero semiconductor region end. To this end, the gate electric field strength of the heterojunction driving end of the outermost periphery hetero semiconductor region 9 is less than the gate electric field strength of the heterojunction driving end of the hetero semiconductor region 3 of the basic cell. However, any structure can achieve the same effects so long as it is capable of allowing the gate electric field strength of the heterojunction driving end of the outermost periphery hetero semiconductor region 9 to be less than the gate electric field strength of the heterojunction driving end of the hetero semiconductor region 3.

In the second embodiment, the electric field alleviation region 10 and the outermost periphery electric field alleviation region 11 are equally formed. However, they may be differently formed. For example, the electric field alleviation region 10 may not be formed. In this situation, when in the interruption state, only the drain electric field to the heterojunction of the outermost periphery hetero semiconductor region 9 and the drift region 2 is alleviated, and the drain electric field strength of the heterojunction driving end of the outermost periphery hetero semiconductor region 9 is less than the drain electric field strength of the heterojunction driving end of the hetero semiconductor region 3 of the basic cell. Thus, in the interruption state, regardless of the conductive type of the impurity or the impurity concentration of the outermost periphery hetero semiconductor region 9, the leak current of the outermost switch structure is reduced. This example is non-limiting. That is, any structure can achieve the same effects so long as it is capable of reducing the drain electric field strength of the heterojunction driving end of the outermost periphery hetero semiconductor region 9 to be less than the drain electric field strength of the heterojunction driving end of the hetero semiconductor region 3 of the basic cell.

In the semiconductor device according to the third embodiment, the P$^+$-type outermost periphery hetero semiconductor region 9 is formed. However, because the inclined angle "a" of the outermost periphery hetero semiconductor region end is larger than the inclined angle "b" of the hetero semiconductor region end, any conductive type of the impurity or impurity concentration of the outermost periphery hetero semiconductor region may be adopted. The mask material 17 is SiO$_2$ film and the mask material 18 is photoresist in the third embodiment. However, other materials such as SiN film may be utilized. Likewise, the combination of the SiO$_2$ film and the photoresist is not meant to be limiting. That is, a combination of other materials such as SiN film may be used. Further, the same mask material for each merely varying an inclined angle or thickness may be adopted.

As can be seen, the above-described embodiments have been described in order to allow easy understanding of the invention and do not limit the invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A semiconductor device, comprising:
   a plurality of inner switch structures arranged in parallel and integrated in an inner portion on one semiconductor chip, each switch structure including:
   a semiconductor substrate formed from a first semiconductor material;
   a hetero semiconductor region formed from a second semiconductor material having a band gap width different from that of the first semiconductor material, the hetero semiconductor region being hetero-adjoined with the semiconductor substrate;
   a gate insulation film adjoined to a heterojunction of the semiconductor substrate and the hetero semiconductor region;
   a gate electrode adjoined to the gate insulation film;
   a source electrode connected to a source contact portion of the hetero semiconductor region; and
   a drain electrode connected to the semiconductor substrate; and
   an outer switch structure arranged at an outermost portion of the semiconductor chip and not forming one of the plurality of inner switch structures, the outer switch structure including:
   an outer hetero semiconductor region formed of a third semiconductor material having different conductive-type impurities than the second semiconductor material and hetero-adjoined with the semiconductor substrate;
   an outer gate insulation film adjoined to a heterojunction of the semiconductor substrate and the outer hetero semiconductor region; and
   an outer gate electrode adjoined to the outer gate insulation film;
   wherein the source electrode of one of the plurality of inner switch structures is connected to a source contact portion of the outer hetero semiconductor region; and
   wherein the outer switch structure is a current-resistant structure configured to reduce current flowing at the outer switch structure when the inner switch structures are conducting the current.

2. The semiconductor device according to claim 1 wherein a first hetero barrier height of the outer hetero semiconductor region is higher than a second hetero barrier height of the hetero semiconductor regions of the inner switch structures.

3. The semiconductor device according to claim 2 wherein a conductive type of the outer hetero semiconductor region differs from a conductive type of the semiconductor substrate.

4. The semiconductor device according to claim 1, wherein a heterojunction driving end is a region where a respective heterojunction between hetero semiconductor regions and the semiconductor substrate is adjoined to a respective gate insulation film, and wherein the outer switch structure has a resistance from its heterojunction driving end to its source contact portion greater than a resistance from a source contact portion of an inner switch structure to its heterojunction driving end.

5. The semiconductor device according to claim 4 wherein an impurity concentration of the outer hetero semiconductor region is less than an impurity concentration of the hetero semiconductor regions of the inner switch structures.

6. The semiconductor device according to claim 1, wherein a heterojunction driving end is a region where a respective heterojunction between hetero semiconductor regions and the semiconductor substrate is adjoined to a respective gate insulation film, and wherein the outer switch structure comprises an outermost electric field alleviating region adjoined to its heterojunction driving end and the inner switch structures comprise an electric field alleviating region in areas adjoined to the semiconductor substrate and one of the hetero semiconductor region or the gate insulation film.

7. The semiconductor device according to claim 6 wherein a gate electric field strength of the heterojunction driving end of the outer switch structure is less than a gate electric field strength of the heterojunction driving end of the inner switch structures when in a conduction state.

8. The semiconductor device according to claim 6 wherein a drain electric field strength of the heterojunction driving end of the outer switch structure is less than a drain electric field strength of the heterojunction driving end of the inner switch structures when in an interruption state.

9. The semiconductor device according to claim 1 wherein an angle between the heterojunction of the semiconductor substrate and the outer hetero semiconductor region and the outer gate insulation film is greater than an angle between a respective heterojunction and gate insulation film of the inner switch structures.

10. The semiconductor device according to claim 9 wherein a heterojunction driving end is a region where a respective heterojunction between hetero semiconductor regions and the semiconductor substrate is adjoined to a respective gate insulation film and wherein a drain electric field strength of a heterojunction driving end of the outer switch structure is less than a drain electric field strength of heterojunction driving ends of the inner switch structures when in an interruption state.

11. The semiconductor device according to claim 9 wherein a hetero barrier height of the outer hetero semiconductor region is greater than a hetero barrier height of the hetero semiconductor region of each inner switch structure.

12. The semiconductor device according to claim 11 wherein a conductive type of the outer hetero semiconductor region differs from a conductive type of the semiconductor substrate.

13. The semiconductor device according to claim 9 wherein a heterojunction driving end is a region where a respective heterojunction between hetero semiconductor regions and the semiconductor substrate is adjoined to a respective gate insulation film, and wherein a resistance from a heterojunction driving end of the outer switch structure to the source contact portion of the outer switch structure is greater than a resistance from a heterojunction driving end of each inner switch structure to the source contact portion of each inner switch structure.

14. The semiconductor device according to claim 13 wherein an impurity concentration of the outer hetero semiconductor region is less than an impurity concentration of the hetero semiconductor regions of the inner switch structures.

15. The semiconductor device according to claim 9, wherein a heterojunction driving end is a region where a respective heterojunction between hetero semiconductor regions and the semiconductor substrate is adjoined to a respective gate insulation film and further comprising:
    an outermost electric field alleviating region adjoined to a heterojunction driving end of the outer switch structure and not adjoined to heterojunction driving ends of the inner switch structures.

16. The semiconductor device according to claim 15 wherein a gate electric field strength of the heterojunction driving end of the outer switch structure is less than a respective gate electric field strength of the heterojunction driving ends of the inner switch structures when in a conduction state.

17. The semiconductor device according to claim 15 wherein a drain electric field strength of the heterojunction driving end of the outer switch structure is less than a respective drain electric field strength of the heterojunction driving ends of the inner switch structures when in an interruption state.

18. The semiconductor device according to claim 1 wherein the first semiconductor material is formed from at least one of silicon carbide, diamond, and gallium nitride.

19. The semiconductor device according to claim 1 wherein the second semiconductor material is formed from at least one of a single crystal silicon, a polycrystalline silicon, and an amorphous silicon.

* * * * *